United States Patent [19]

Mallinson et al.

[11] Patent Number: 4,881,791
[45] Date of Patent: Nov. 21, 1989

[54] OPTICAL DEVICE

[75] Inventors: Stephen R. Mallinson, Ipswich; Colin A. Millar, Felixstowe, both of England

[73] Assignee: British Telecommunications Public Limited Company, Great Britain

[21] Appl. No.: 288,036
[22] PCT Filed: Apr. 28, 1988
[86] PCT No.: PCT/GB88/00333
§ 371 Date: Dec. 19, 1988
§ 102(e) Date: Dec. 19, 1988
[87] PCT Pub. No.: WO88/08548
PCT Pub. Date: Nov. 3, 1988

[30] Foreign Application Priority Data

Apr. 28, 1987 [GB] United Kingdom ............... 8710067

[51] Int. Cl.⁴ .................................................. G02B 6/34
[52] U.S. Cl. ............................ 350/96.19; 350/96.12; 350/96.13; 350/96.15
[58] Field of Search ............... 350/96.11, 96.12, 96.13, 350/96.14, 96.15, 96.19, 96.29; 370/3

[56] References Cited

U.S. PATENT DOCUMENTS

| | | | |
|---|---|---|---|
| 3,891,302 | 6/1975 | Dabby et al. | 350/96.19 X |
| 3,898,585 | 8/1975 | Heidrich et al. | 350/96.19 X |
| 4,006,963 | 2/1977 | Baues et al. | 350/96.19 X |
| 4,268,116 | 5/1981 | Schamadel et al. | 350/96.29 |
| 4,386,822 | 6/1983 | Bergh | 350/96.15 |
| 4,466,694 | 8/1984 | MacDonald | 350/96.19 |
| 4,531,809 | 7/1985 | Carter et al. | 350/96.19 |
| 4,583,818 | 4/1986 | Chen et al. | 350/96.19 |
| 4,622,663 | 11/1986 | Ishikawa et al. | 370/3 |
| 4,695,123 | 9/1987 | Chang et al. | 350/96.15 |
| 4,737,007 | 4/1988 | Alferness et al. | 350/96.19 |
| 4,828,350 | 5/1989 | Kim et al. | 350/96.15 |

FOREIGN PATENT DOCUMENTS

| | | | |
|---|---|---|---|
| 0212773 | 3/1987 | European Pat. Off. | 350/96.19 X |
| 0212815 | 3/1987 | European Pat. Off. | 350/96.19 X |
| 2558607 | 7/1985 | France | 350/96.15 X |
| 2161648 | 1/1986 | United Kingdom | 350/96.15 X |
| 2170016 | 7/1986 | United Kingdom | 350/96.15 X |

OTHER PUBLICATIONS

Russell et al., "Grating-Fiber Coupler as a High-Resolution Spectrometer", Optics Lett. 6/85, vol. 10, No. 6, pp. 291-293.
Zhang et al., "Single-Mode Fiber-Film Directional Coupler", J. Lt. Tech., vol. LT-5, No. 2, Feb. 1987, pp. 260-267.
Bennion et al., "High Reflectivity Monomode-Fibre Grating Filters", Elect. Lett. vol. 22, No. 6, 3/86, pp. 341-343.
Brinkmeyer et al., "Fibre Bragg Reflector For Mode Selection", . . . Electronics Letters, 1/86, vol. 22, No. 3, pp. 134-135.
Millar et al., "Exposed-Core Single-Mode-Fiber Channel-Dropping Filter", . . . Optics Lett., vol. 12, No. 4, 4/87, pp. 284-286.

Primary Examiner—William L. Sikes
Assistant Examiner—Brian M. Healy
Attorney, Agent, or Firm—Nixon & Vanderhye

[57] ABSTRACT

An optical device comprises an optical waveguide, such as a single mode optical fiber (11), underlying a first layer (2) of material, such as a thin film, which has a refractive index higher than the refractive index of the waveguide (11) and which forms a planar waveguide capable of supporting and guiding at least one propagation mode of a higher order than, but matching the phase velocity of, the propagation mode or modes in the underlying waveguide. A reflection diffraction grating (4) is provided on or adjacent to the surface of the first layer (2) remote from the waveguide (11). The arrangement is such that an optical signal which is coupled from the waveguide (11) into the first layer (2) is reflected by the reflection diffraction grating (4) and is coupled back into the waveguide.

11 Claims, 2 Drawing Sheets

OPTICAL DEVICE

BACKGROUND OF THE INVENTION

The invention relates to an optical device.

There is currently considerable interest in the use of high-reflectivity grating filters for use as feedback and filtering elements in, for example, fibre lasers. At present, the generation of high reflectivity grating filter involves etching gratings formed in photoresist on top of polished directional couplers and providing an overlying layer of oil with a refractive index matching that of the underlying waveguide. An example of this is described in "High-Reflectivity Monomode-Fibre Grating Filters" Electronics Letters, 13th March 1986, Vol. 22, No. 6, pages 341–343.

The generation of these filters involves complex fabrication procedures which are difficult to circumvent and expensive.

SUMMARY OF THE INVENTION

In accordance with the present invention, an optical device comprises an optical waveguide underlying a first layer of material which has a refractive index higher than the effective refractive index of the waveguide and which forms a planar waveguide capable of supporting and guiding at least one propagation mode of a higher order than, but matching the phase velocity of, the propagation mode or modes in the underlying waveguide; and a diffraction grating provided on or adjacent to at least one surface of the first layer, the arrangement being such that an optical signal with a selected wavelength which is coupled from the waveguide into the first layer impinges on the diffraction grating and is coupled back into the waveguide.

This invention provides an alternative approach to the etching of gratings directly onto the waveguide by applying the grating in a high index overlay structure. The wavelength which is selected can be predetermined but in some cases the refractive index of the first layer of material could be tuned. This might be possible if the material of the first layer was electro-optic (eg. a liquid crystal).

In most cases several optical modes will be coupled into the first layer but only one will be reflected. However, in other cases just one optical mode might be coupled in the first layer.

The diffraction grating is preferably provided on or adjacent to the surface of the first layer remote from the waveguide. This enables the diffraction grating to be made independently of the remainder of the device. However it could be provided on the surface adjacent the waveguide or two diffraction gratings could be provided, one on each surface.

Preferably, the device further comprises a second layer (or superstrate) overlying the first layer with the surface of the second layer facing the first layer being provided with the diffraction grating.

Typically, the second layer will form a non-guiding superstrate having a substantially planar surface and a refractive index which is lower than the effective refractive index of the first layer for a given mode of propagation.

The first layer and the superstrate are preferably in intimate contact. This obviates the need for an index matching liquid between the first layer and the superstrate. The waveguide and the first layer are also preferably in intimate contact but may be spaced a small distance apart. For effective coupling, close proximity of the waveguide and first layer are required for strong field coupling, providing a degree of lateral confinement of the field in the first layer.

The waveguide conveniently comprises an optical fibre, and is preferably an optical single mode fibre.

In another form of the invention, the waveguide may comprise a waveguide associated with, or forming part of, an integrated optics device.

The optical device according to the invention may be used in a wide variety of applications but is particularly suited for use as feedback or filtering elements in fibre lasers.

The diffraction grating preferably comprises a reflection diffraction grating although a phase grating without a reflective layer could also be used.

Reflection at the diffraction grating will occur when the Bragg condition is satisfied, that is:

$$\lambda = 2n_e D$$

where $\lambda$ is the free-space wavelength, $n_e$ is the effective refractive index of the guided mode in the first layer, and $D$ is the period of the diffraction grating.

A full discussion of the coupling of optical modes between the waveguide and the first layer is contained in "Exposed-Core Single-Mode Fibre-Channel-Dropping Filter Using a High-Index Overlay Waveguide" published in Optics Letters, April 1987, vol 12, No. 4, from page 284.

The refractive index (n) of a material is understood herein to be the bulk refractive index of the material as determined by means of an Abbé refractometer, for example. The effective refractive index ($n_e$) is the ratio of the speed of light in vacuo (c) to the phase velocity ($v_p$) of the guided mode concerned.

The refractive index of the first layer is at least 1%, and preferably at least 15%, greater than the effective refractive index of the waveguide. However, it has been calculated that efficient coupling will be obtained even in cases where the refractive index of the first layer is 60% higher than the effective refractive index of the waveguide:

BRIEF DESCRIPTION OF THE INVENTION

An example of an optical device in accordance with the present invention will now be described with reference to the accompanying drawings, in which.

DETAILED DESCRIPTION OF THE INVENTION

Figure 1:
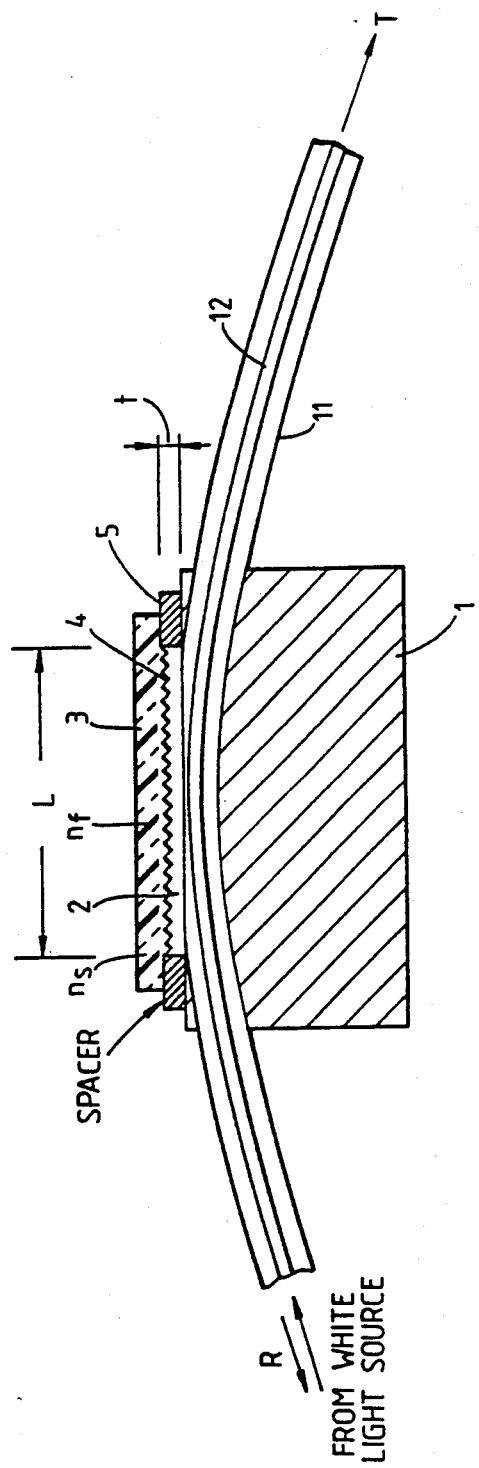
FIG. 1 is a schematic sectional view through the device.

The optical device shown in FIG. 1 comprises a polished optical fibre half-coupler 1 incorporating an optical single mode fibre wave guide, 11 and underlying a first layer formed by a thin film 2. A substrate in the form of a fused silica slide 3 is mounted on top of the film 2 and a spacer 5. The exposed fibre length is approximately 520 $\mu$m. Also, close proximity of fibre and overlay ensures good coupling. Optical fibre half-couplers of this type are described, for example, by B. Nayar, "Int Optics", Eds. Nolting and Ulrich, Springer Series in Opt. Sc., Vol 48, Springer Verlag 1985. The construction of the polished half-couplers as such is not of the essence of the present invention and hence need not be discussed here in detail. For the present purposes it is sufficient to note that the fibre 11 was standard British Telecom type "B" single mode fibre, that the radius of fibre curvature in the half-coupler was 25 cm, and that the cladding of the fibre 11 was removed by polishing to within 1 $\mu$m of the fibre core 12.

Optical fibres such as those used in the fabrication of the half-couplers have an effective refractive index of approximately 1.45 at a wavelength of nominally 1.5 $\mu$m.

The thin film overlay 2 is a thin overlay of proprietary refractive index liquid, e.g. as supplied by Cargille Inc. of 55 Cedar Grove, N.J., U.S.A.

The surface of the substrate 3 which engages the thin film overlay 2 is provided with a diffraction grating 4 which, in one example, has 2400 lines/mm. This is pressed onto the coupler 1 with an interaction length L with the film overlay 2 of about 3 mm. The refractive index of the thin film overlay 2 was, in this example, chosen to be 1.60.

Figure 2A:
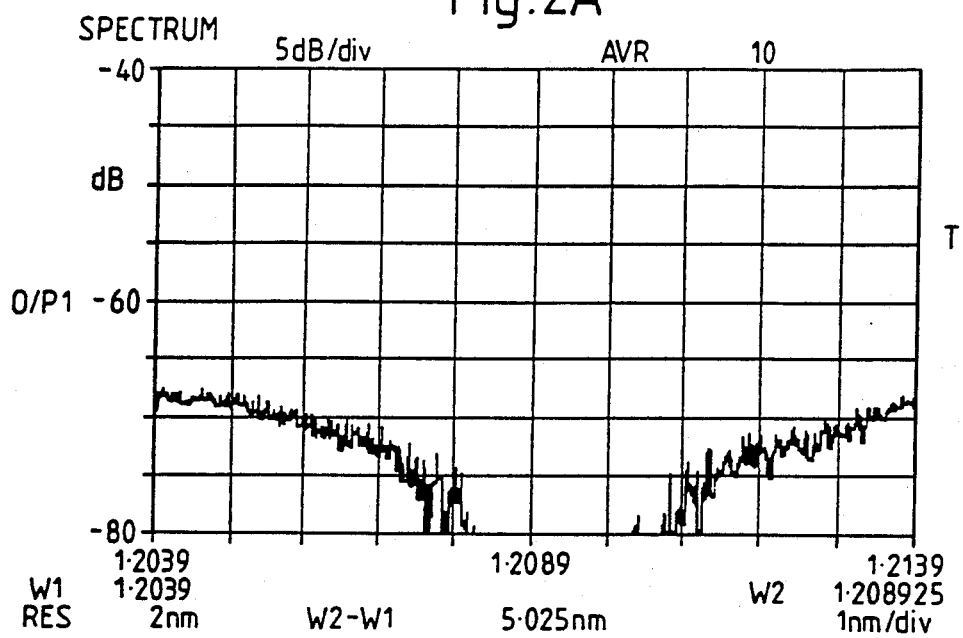
FIG. 2A and 2B illustrate the transmission and reflection response respectively of the device.
Figure 2B:
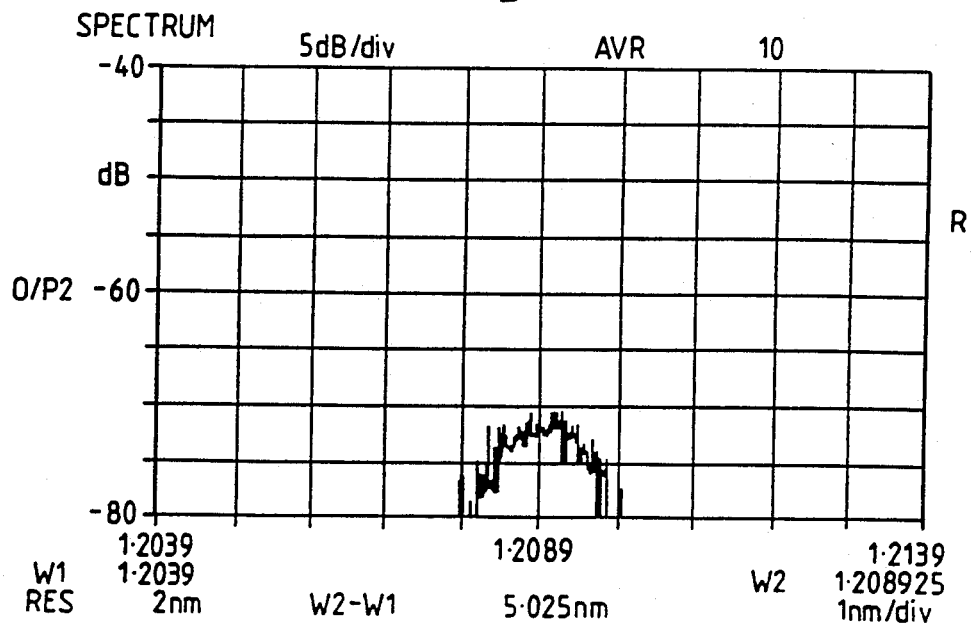

In an experiment to test the response of the device, white light was injected into the optical fibre 11 and a week back reflected signal R was observed at a wavelength of 1.2089 micron, but only when the thickness (t) of the film 2 was adjusted to give channel dropping at that wavelength. FIG. 2A illustrates the variation in intensity of the transmitted signal T with wavelength while FIG. 2B illustrates the variation in intensity of the reflected signal signal R with wavelength. It will be seen from FIG. 2 that there is a peak in the reflected signal intensity at 1.2089 micron.

In other examples (not shown), the spacer 5 could be much thinner or even omitted.

We claim:

1. An optical device comprising an optical waveguide underlying a first layer of material which has a refractive index higher than the effective refractive index of the waveguide and which forms a planar waveguide capable of supporting and guiding at least one propagation mode of a higher order than, but matching the phase velocity of, the propagation mode or modes in the underlying waveguide; and a diffraction grating provided on or adjacent to a least one surface of the first layer, the arrangement being such that an optical signal which is coupled from the waveguide into the first layer impinges on the diffraction grating and is coupled back to the waveguide.

2. A device according to claim 1, wherein the diffraction grating is provided on or adjacent to the surface of the first layer remote from the waveguide.

3. A device according to claim 2, further comprising a second layer overlying the first layer with the surface of the second layer facing the first layer providing the diffraction grating.

4. A device according to claim 3 wherein the second layer forms a non-guiding superstrate having a substantially planar surface and a refractive index which is lower than the effective refractive index of the first layer for a given mode of propagation.

5. A device according to claim 4 wherein the first layer and the superstrate are in intimate contact.

6. A device according to any of the preceding claims wherein the waveguide and the first layer are in intimate contact.

7. A device according to any of claims 1 to 5, wherein the first layer comprises a thin film.

8. A device according to any of the preceding claims 1 to 5, wherein the diffraction grating comprises a reflection diffraction grating.

9. A device according to any of the preceding claims 1 to 5 wherein the refractive index or the first layer is at least 1% greater than the effective refractive index of the waveguide.

10. A device according to anyone of claims 1–5 wherein the refractive index of the first layer is at least 15% greater than the effective refractive index of the waveguide.

11. A device according to any one on claims 1–5 wherein the refractive index of the first layer is at least 60% higher than the effective refractive index of the waveguide.

* * * * *